(12) United States Patent
Jain et al.

(10) Patent No.: US 11,637,181 B2
(45) Date of Patent: Apr. 25, 2023

(54) LATERAL BIPOLAR TRANSISTORS WITH POLYSILICON TERMINALS

(71) Applicant: GLOBALFOUNDRIES U.S. Inc., Malta, NY (US)

(72) Inventors: Vibhor Jain, Williston, VT (US); Alvin J. Joseph, Williston, VT (US); Alexander Derrickson, Troy, NY (US); Judson R. Holt, Ballston Lake, NY (US); John J. Pekarik, Underhill, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/509,327

(22) Filed: Oct. 25, 2021

(65) Prior Publication Data
US 2023/0057695 A1 Feb. 23, 2023

Related U.S. Application Data

(60) Provisional application No. 63/235,368, filed on Aug. 20, 2021.

(51) Int. Cl.
*H01L 29/08* (2006.01)
*H01L 29/735* (2006.01)
*H01L 29/66* (2006.01)
*H01L 29/417* (2006.01)

(52) U.S. Cl.
CPC ...... *H01L 29/0821* (2013.01); *H01L 29/0808* (2013.01); *H01L 29/41708* (2013.01); *H01L 29/6625* (2013.01); *H01L 29/735* (2013.01)

(58) Field of Classification Search
CPC ............ H01L 29/0821; H01L 29/0808; H01L 29/41708; H01L 29/6625; H01L 29/735
See application file for complete search history.

(56) References Cited

U.S. PATENT DOCUMENTS

| | | |
|---|---|---|
| 6,949,764 B2 | 9/2005 | Ning et al. |
| 8,772,837 B2 | 7/2014 | Suligoj et al. |
| 9,536,788 B1 | 1/2017 | Ning et al. |
| 10,224,411 B2 | 3/2019 | Mallikarjunaswamy et al. |
| 2005/0116254 A1* | 6/2005 | Verma ............... H01L 29/66242 257/E29.188 |

OTHER PUBLICATIONS

Mitrovic et al.; Review of SiGe HBTs on SOI; Solid State Electronics, 49 (2005) 1556-1567 (Year: 2005).*

* cited by examiner

*Primary Examiner* — Syed I Gheyas
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to lateral bipolar transistors and methods of manufacture. The structure includes: an extrinsic base comprising semiconductor material; an intrinsic base comprising semiconductor material which is located below the extrinsic base; a polysilicon emitter on a first side of the extrinsic base; a raised collector on a second side of the extrinsic base; and sidewall spacers on the extrinsic base which separate the extrinsic base from the polysilicon emitter and the raised collector.

20 Claims, 9 Drawing Sheets

LATERAL BIPOLAR TRANSISTORS WITH POLYSILICON TERMINALS

FIELD OF THE INVENTION

The present disclosure relates to semiconductor structures and, more particularly, to lateral bipolar transistors and methods of manufacture.

BACKGROUND

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an extrinsic base comprising semiconductor material; an intrinsic base comprising semiconductor material which is located below the extrinsic base; a polysilicon emitter on a first side of the extrinsic base; a raised collector on a second side of the extrinsic base; and sidewall spacers on the extrinsic base which separate the extrinsic base from the polysilicon emitter and the raised collector.

In an aspect of the disclosure, a structure comprises: an emitter comprising polysilicon over a semiconductor on insulator substrate; an extrinsic base laterally adjacent to the polysilicon emitter and over the semiconductor on insulator substrate; a raised collector laterally adjacent to the extrinsic base and comprising single crystalline semiconductor material over the semiconductor on insulator substrate; and sidewall spacers comprising dielectric material separating the extrinsic base from the polysilicon emitter and the raised collector.

In an aspect of the disclosure, a method comprises: forming an extrinsic base comprising semiconductor material; forming an intrinsic base comprising semiconductor material which is located below the extrinsic base; forming a polysilicon emitter on a first side of the extrinsic base; forming a raised collector on a second side of the extrinsic base; and forming sidewall spacers on the extrinsic base which separate the extrinsic base from the polysilicon emitter and the raised collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to lateral bipolar transistors and methods of manufacture. More specifically, the present disclosure relates to lateral bipolar transistors with a polysilicon emitter. Advantageously, the lateral bipolar transistors with polysilicon emitter provides improved beta and emitter/base junction control and a lower Rb (base resistance), in addition to high fT/fmax.

More specifically, in embodiments, the lateral bipolar transistor comprises a polysilicon emitter with a SiGe or Si intrinsic base in semiconductor on insulator (SOI) technology. In embodiments, the SiGe base may be within the SOI layer, e.g., Si, and may be contacting the underlying insulator material of the SOI technology. In alternative embodiments, the SiGe base may be above the SOI layer, e.g., Si. In further embodiments, the extrinsic base, the polysilicon emitter and epitaxial collector are separated by a dielectric spacer which surrounds the extrinsic base vertically above the intrinsic base.

The collector region may include a raised single crystal semiconductor material, which may be lightly doped for improved Bvcbo/BVceo (without losing self-alignment). The polysilicon emitter may touch the intrinsic base material. Also, in further embodiments, the polysilicon emitter region may be in contact with or above the underlying insulator material of the SOI technology, depending on the particular layout in accordance with aspects of the present disclosure.

The lateral bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistors of the present disclosure have been adopted from integrated circuit (IC) technology. For example, the structures are built on wafers and are realized in films of material patterned by photolithographic processes on the top of a wafer. In particular, the fabrication of the lateral bipolar transistors uses three basic building blocks: (i) deposition of thin films of material on a substrate, (ii) applying a patterned mask on top of the films by photolithographic imaging, and (iii) etching the films selectively to the mask.

Figure 1:
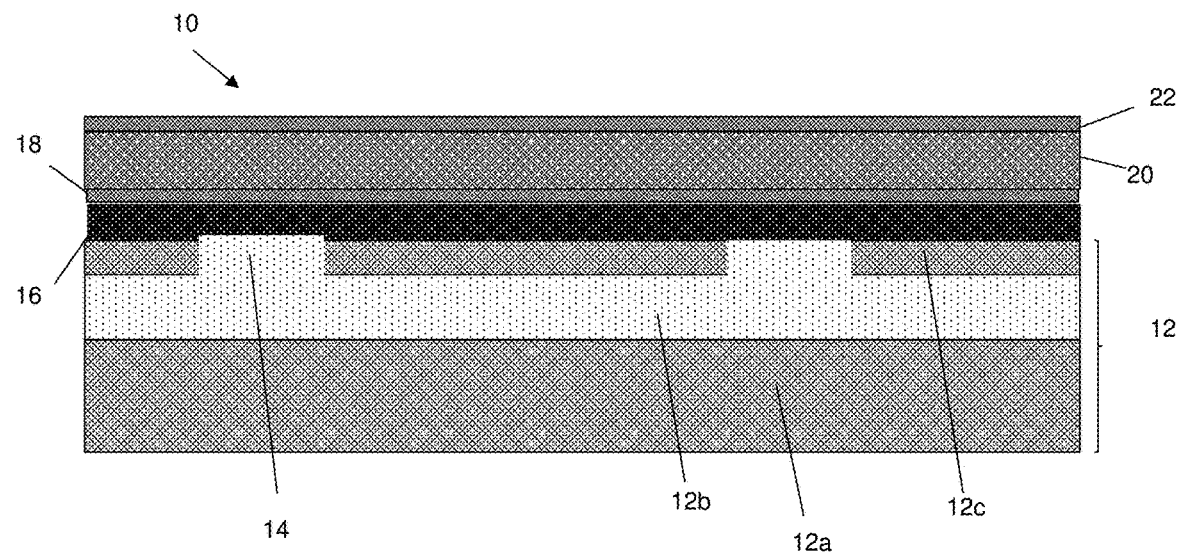
FIG. 1 shows a substrate with additional material layers on a surface of the substrate, amongst other features, and respective fabrication processes in accordance with aspects of the present disclosure.

FIG. 1 shows a substrate with shallow trench isolation structures and additional layers on the surface of the substrate, amongst other features, and respective fabrication processes. In particular, the structure 10 of FIG. 1 includes a substrate 12 and shallow trench isolation regions 14 formed within the substrate 12. In embodiments, the substrate 12 comprises a semiconductor-on-insulator (SOI) substrate. More specifically, the substrate 12 includes a semiconductor handle wafer 12a, an insulator layer 12b and a semiconductor layer 12c on the insulator layer 12b. The semiconductor handle wafer 12a provides mechanical support to the insulator layer 12b and the semiconductor layer 12c.

In the SOI implementation, the semiconductor handle wafer 12a and the semiconductor layer 12c may be composed of any suitable semiconductor material including, but not limited to, Si, SiGe, SiGeC, SiC, GaAs, InAs, InP, and other III/V or II/VI compound semiconductors. Moreover, the semiconductor handle wafer 12a and the semiconductor layer 12c may comprise any suitable single crystallographic orientation (e.g., a (100), (110), (111), or (001) crystallographic orientation). The semiconductor layer 12c may be formed by a deposition process, such as chemical vapor deposition (CVD) or plasma enhanced CVD (PECVD). Alternatively, the semiconductor layer 12c may be formed using a smart cut process where two semiconductor wafers are bonded together with an insulator material between the two semiconductor wafers.

The insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In another embodiment, the insulator layer 12b may be formed using a thermal growth process, such as thermal oxidation, to convert a surface portion of the semiconductor handle wafer 12a to an oxide material, e.g., insulator layer 12b. In yet another embodiment, the insulator layer 12b can be formed by implanting oxygen atoms into a bulk semiconductor substrate and thereafter annealing the structure.

Still referring to FIG. 1, shallow trench isolation structures 14 are formed within the semiconductor layer 12c and extending to the insulator layer 12b. In embodiments, the shallow trench isolation structures 14 can be formed by conventional lithography, etching and deposition methods known to those of skill in the art. For example, a resist formed over the semiconductor layer 12c is exposed to energy (light) to form a pattern (opening). An etching process with a selective chemistry, e.g., reactive ion etching (RIE), will be used to form one or more trenches in the semiconductor layer 12c through the openings of the resist. Following the resist removal by a conventional oxygen ashing process or other known stripants, insulator material (e.g., $SiO_2$) can be deposited within the trenches by any conventional deposition process, e.g., chemical vapor deposition (CVD) processes. Any residual insulator material on the surface of the semiconductor layer 12c can be removed by conventional chemical mechanical polishing (CMP) processes.

A semiconductor material 16 may be formed on the semiconductor layer 12c and over the shallow trench isolation structures 14. In embodiments, the semiconductor material 16 may be single crystalline Si material, deposited using a conventional deposition method such as an epitaxial growth process known to those of skill in the art such that no further explanation is required for complete understanding of the present disclosure. A marker layer 18 may be formed on the semiconductor material 16. In embodiments, the marker layer 18 may be a semiconductor material that has a different etch signature than the semiconductor material 16. For example, the marker layer 18 may be SiGe material; although other materials are also contemplated herein. The marker layer 18 may also be deposited using an epitaxial growth process.

FIG. 1 further shows a collector material 20 formed on the marker layer 18. The collector material 20 may be epitaxial grown single crystalline semiconductor material with an in-situ doping. For example, the collector material 20 may be N+ doped Si material, and more preferably N+ doped SiC material. The N+ doped material may comprise Arsenic as an illustrative non-limiting example. Alternatively, the n-type dopants may be e.g., Phosphorus (P) or Sb, among other suitable examples. As should be understood by those of skill in the art and as described in more detail herein, the collector material 20 will be used to form a raised collector region comprising single crystalline semiconductor material. As already noted, the light doping of N+ dopant will provide improved Bvcbo/BVceo.

A cap layer 22 may be formed over the collector material 20, e.g., raised collector region composed of single crystalline semiconductor material. The cap layer 22 may be a nitride material as an example, deposited using a conventional deposition method such as chemical vapor deposition (CVD) processes.

Figure 2:
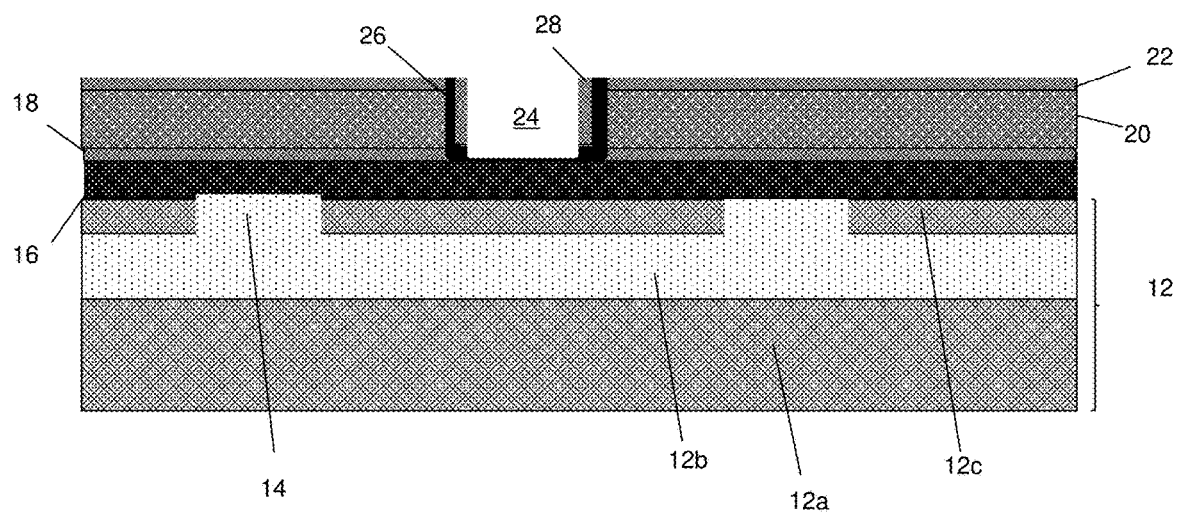
FIG. 2 shows sidewall spacer materials on a sidewall of a trench within the additional material layers, amongst other features, and respective fabrication processes in accordance with aspects of the present disclosure.

FIG. 2 shows sidewall spacer materials 26, 28 on a sidewall of trench 24. In embodiments, sidewall spacer materials 26, 28 may be an oxide material and a nitride material, respectively. In this stage of fabrication, the semiconductor material 16 may be exposed within the trench 24.

The trench 24 is formed by a conventional lithography and etching (e.g., RIE) processes, stopping on the semiconductor material 16. In this process, the marker layer 18 may be used as an etch stop layer or reference layer for the etching process, e.g., due to the etch signature of the marker layer 18 being different than the surrounding materials. Following trench formation, the sidewall spacer materials 26, 28 may be blanket deposited on a surface of the barrier layer 22, sidewalls of the trench 24 and on the semiconductor material 16. The sidewall spacer materials 26, 28 may undergo an anisotropic etching process which removes the material on horizontal surfaces of the structure, thereby exposing the underlying semiconductor material 16 and leaving the sidewall spacer materials 26, 28 on sidewalls of the trench 24.

Figure 3:
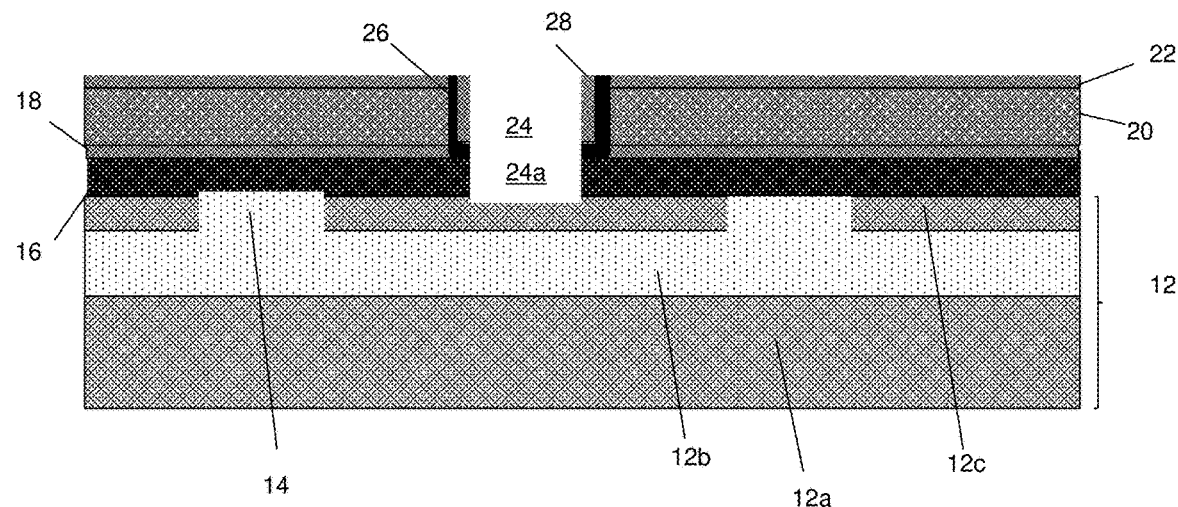
FIG. 3 shows the trench extending into the underlying semiconductor material of the substrate, amongst other features, and respective fabrication processes in accordance with aspects of the present disclosure.

In FIG. 3, the trench 24 is extended into the underlying semiconductor material 16 as noted at reference numeral 24a. More specifically, the extension 24a of the trench 24 is formed by removing the underlying semiconductor material 16, exposing the semiconductor layer 12c. In embodiments, the extension of the trench 24a is a self-aligned etching process due to the use of the sidewall spacer materials 26, 28.

Figure 4:
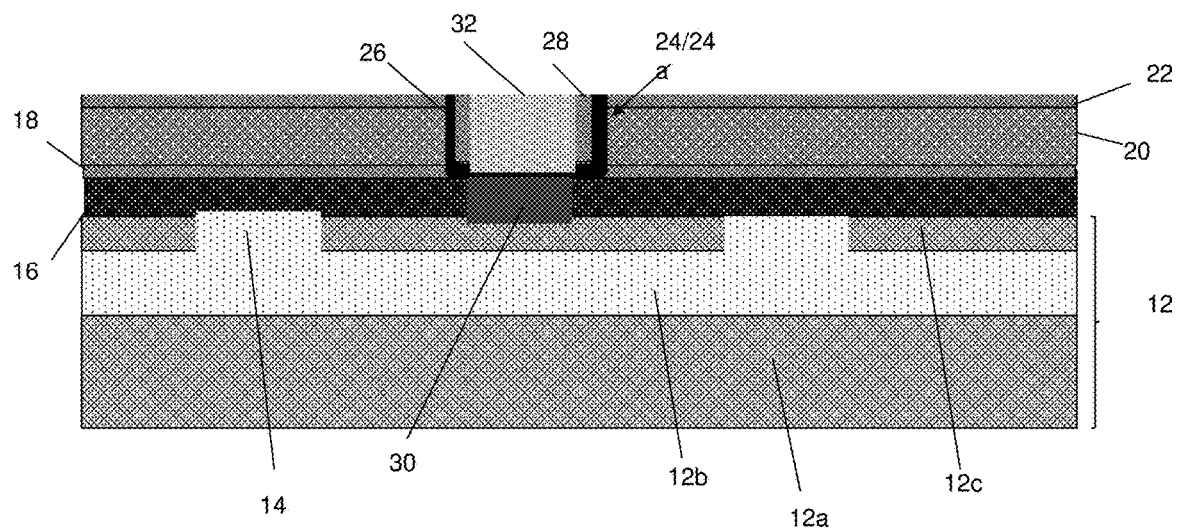
FIG. 4 shows semiconductor material provided within an extension of the trench, amongst other features, and respective fabrication processes in accordance with aspects of the present disclosure.

As further shown in FIG. 4, semiconductor material 30 may be provided within the extension 24a; whereas semiconductor material 32 may be formed in the trench 24 above the semiconductor material 30. In embodiments, the semiconductor material 30 may be used as an intrinsic base and the semiconductor material 32 formed vertically over semiconductor material 30 may be used as an extrinsic base of the bipolar transistor. The extrinsic base may be separated from the collector material 20 by the sidewall spacer materials 26, 28 (dielectric material). The semiconductor material 30 may be p-doped SiGe and the semiconductor material 32 may be P+ doped Si material or P+ doped SiGe where the doping concentration of p+ layer is higher than the p-layer. In the latter embodiment, the SiGe may have a lower percent concentration of Ge compared to Ge concentration of the semiconductor material 30. The semiconductor materials 30, 32 may be formed by an epitaxial growth process within the trench 24 and extension 24a.

Figure 5:
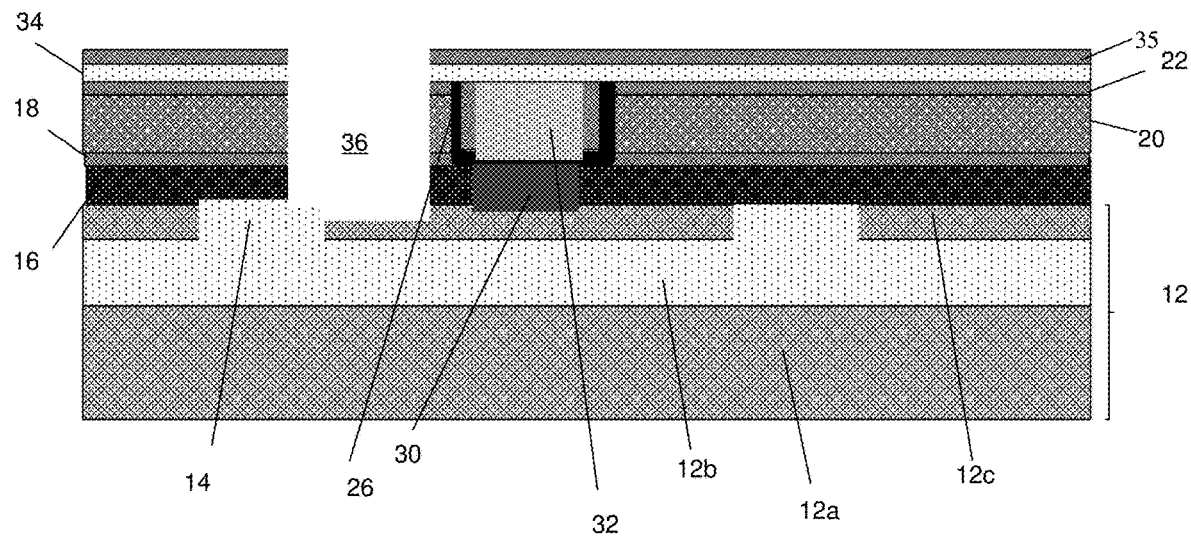
FIG. 5 shows protective layers formed over a cap layer and semiconductor material, amongst other features, and respective fabrication processes in accordance with aspects of the present disclosure.

In FIG. 5, protective layers 34, 35 may be formed over the cap layer 22 and semiconductor material 32. In embodiments, the protective layer 34 may be an oxide material, e.g., $SiO_2$, and the protective layer 35 may be a nitride material, e.g., SiN. The protective layers 34, 35 may be formed by a deposition method such as a CVD process as one illustrative, non-limiting example. A trench 36 is formed through the materials 12c, 16, 18, 20, 22, 34, 35, exposing the insulator layer 12b. In embodiments, the trench 36 may be formed by conventional lithography and etching processes as already described herein, with the marker layer 18 acting as an etch stop or reference layer in the etching process and stopping on the insulator layer 12b.

Figure 6:
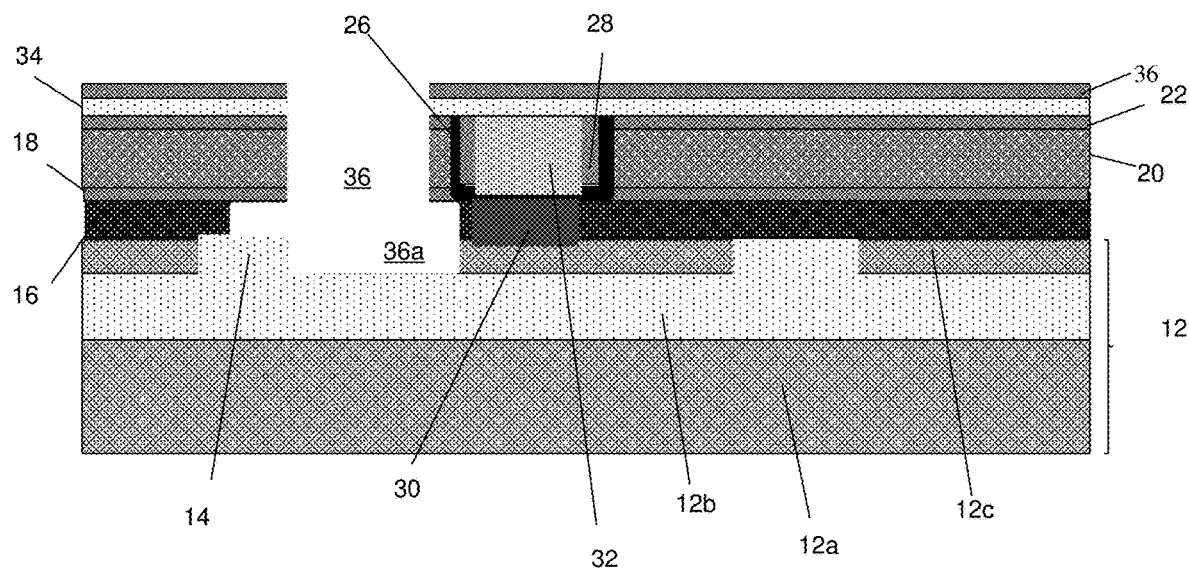
FIG. 6 shows an extension of the trench, amongst other features, and respective fabrication processes in accordance with aspects of the present disclosure.

In FIG. 6, a wet etching process may be performed to provide a lateral extension 36a of the trench 36. The wet etching process will pull back the semiconductor layer 12c and the semiconductor material 16, underneath the sidewall materials 26, 28. The wet etch process should preferably not appreciably attack the insulator layer 12b.

Figure 7:
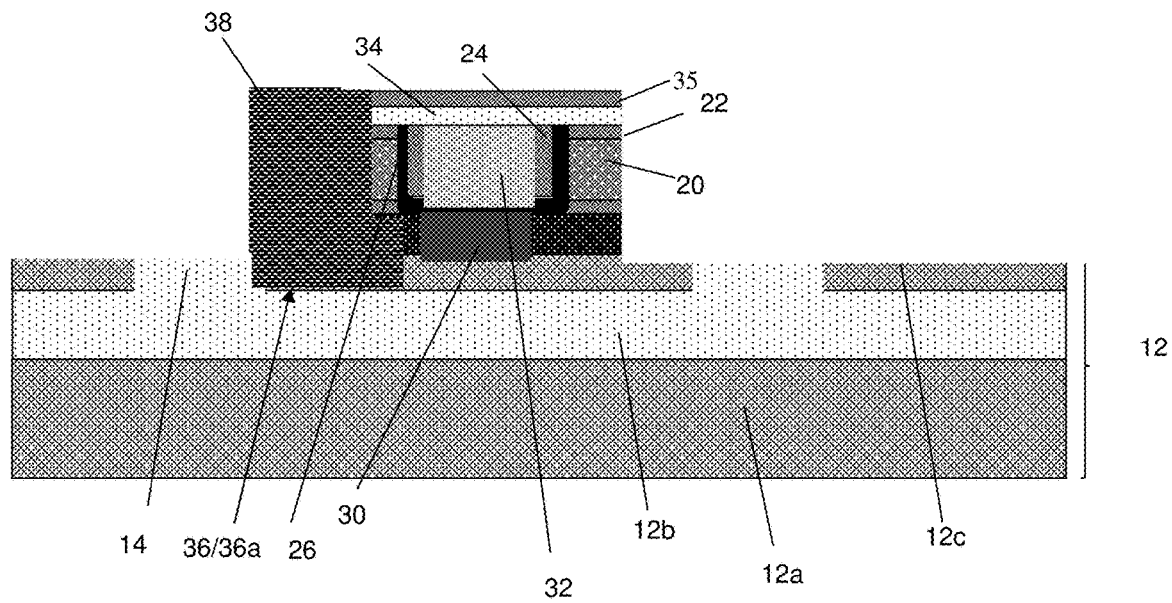
FIG. 7 shows an emitter of a bipolar transistor, amongst other features, and respective fabrication processes in accordance with aspects of the present disclosure.

As further shown in FIG. 7, a polysilicon material 38 may be formed within the trench 36 and extension 36a. The polysilicon material 38 may be an emitter of the bipolar transistor, separated from the semiconductor material 32 (e.g., extrinsic base) by the sidewall spacer materials 26, 28 (dielectric material). In embodiments, the polysilicon material 38 may be an N+ doped polysilicon material. The polysilicon material 38 may be deposited by a blanket deposition process, e.g., CVD, followed by a chemical mechanical planarization (CMP) process to remove any excess material from the material 35.

FIG. 7 further shows defining of the emitter region and collector region. More specifically, as shown in FIG. 7, the materials 16, 18, 20, 22, 34, 35 are patterned by conventional lithography and etching (e.g., RIE) processes. In this way, a collector region, emitter region and base region are now defined. Specifically, the polysilicon material 38 is the emitter region, the semiconductor material 32 is the extrinsic base region and the semiconductor material 20 is a raised, single crystalline collector region. In embodiments, the polysilicon material 38 (e.g., emitter region) may be isolated from the semiconductor material 32 (e.g., extrinsic base) by the sidewall spacer materials 24, 26. Similarly, the semiconductor material 20 (e.g., raised, single crystalline collector region) may be isolated from the semiconductor material 32 (e.g., extrinsic base) by the sidewall spacer materials 24, 26.

Figure 8:
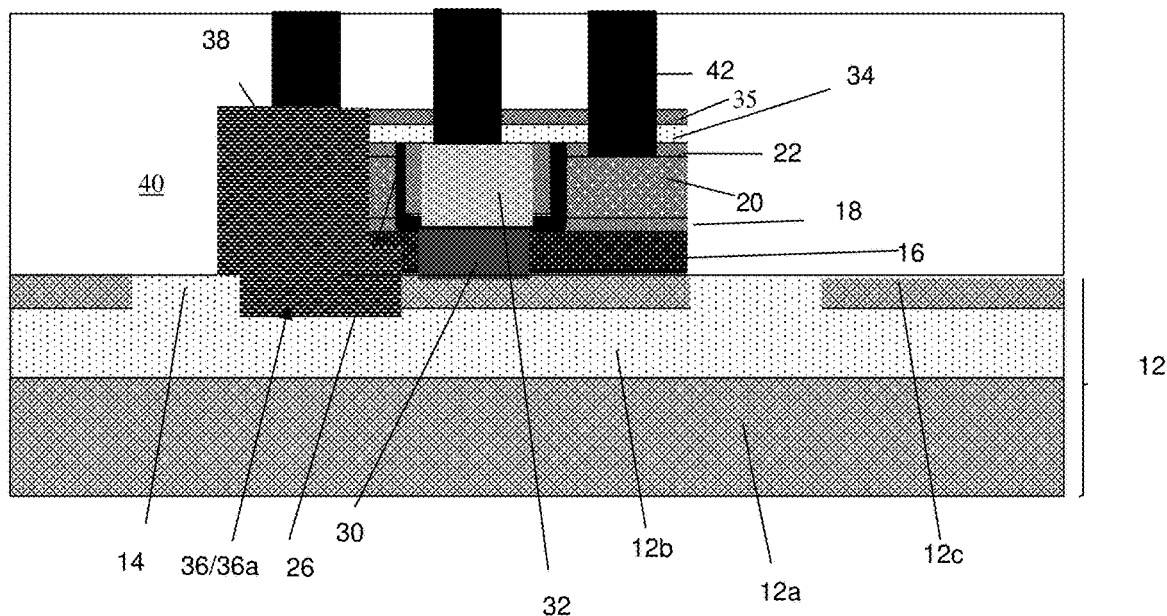
FIG. 8 shows metallization features (e.g., interconnect features) contacting to the emitter, amongst other features, and respective fabrication processes in accordance with aspects of the present disclosure.
Figure 9:
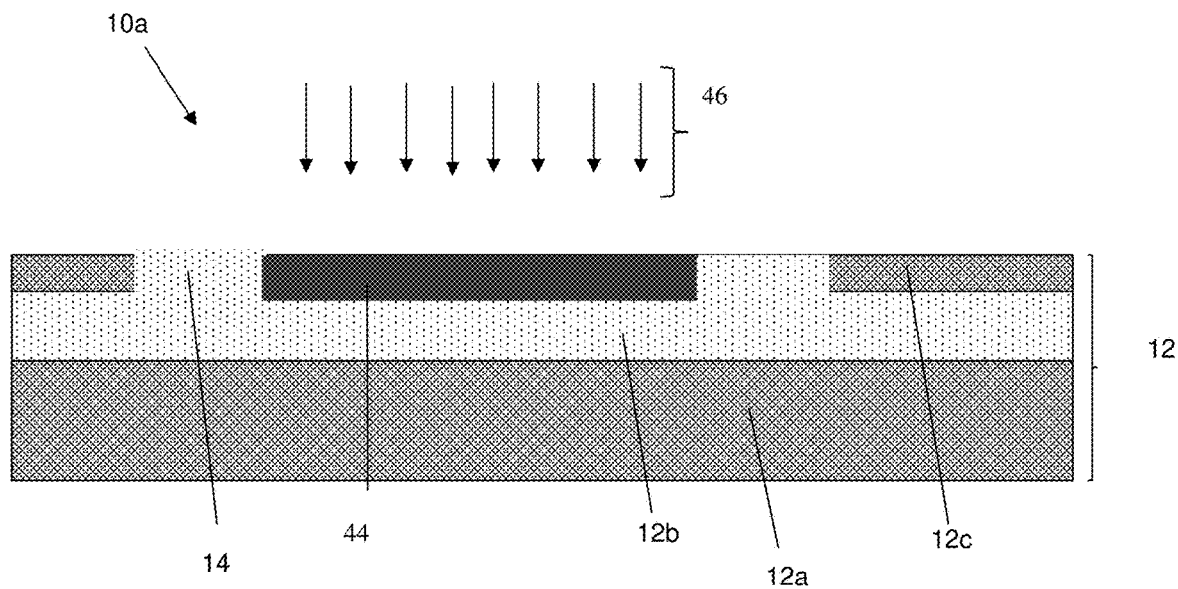
FIGS. 9-17 show a bipolar transistor and respective fabrication processes in accordance with additional aspects of the present disclosure.

In FIG. 8, metallization features 42 (e.g., interconnect features) contact to the emitter region (e.g., polysilicon material 38), extrinsic base region (e.g., semiconductor material 32) and the raised, single crystalline collector region (e.g., semiconductor material 20). To form the metallization features 42, a dielectric material 40 is deposited over the structure using a conventional deposition process, e.g., CVD. The dielectric material 40 can be any appropriate interlevel dielectric material including, e.g., a multi-layer stack of nitride and oxide materials. The dielectric material 40 is subjected to an etching process to form trenches to expose the polysilicon material 38 (e.g., emitter region), the material 32 (e.g., extrinsic base region) and the semiconductor material 20 (e.g., collector region). A conductive material may be formed (e.g., deposited) within the trenches to form the metallization features 42. In embodiments, the conductive metal may be, for example, aluminum or tungsten.

Prior to the formation of the metallization features 24, a silicide layer as known in the art could be formed on upper surfaces of extrinsic base 32, polysilicon emitter 38 and raised collector 20 prior to the formation of the metallization features 42. For example, a Co, Ti, NI, Pt, or similar silicide could be formed prior to metallization features 42. As should be understood by those of skill in the art, the silicide process begins with deposition of a thin transition metal layer, e.g., Co, Ti, NI, Pt, over fully formed and patterned semiconductor devices. After deposition of the material, the structure is heated allowing the transition metal to react with exposed silicon (or other semiconductor material as described herein) in the active regions of the semiconductor device forming a low-resistance transition metal silicide. Following the reaction, any remaining transition metal is removed by chemical etching, leaving silicide contacts in the active regions of the device. Contacts may be formed by conventional deposition of insulator material, trench formation in the insulator material by lithography and etching, followed by metal deposition within the trenches for the contacts (followed by chemical mechanical polishing (CMP)).

FIGS. 9-17 show a bipolar transistor and respective fabrication processes in accordance with additional aspects of the present disclosure. In particular, and starting with FIG. 9, the top semiconductor layer 12c of the substrate 12 may be subjected to an SiGe condensation process to form SiGe layer 44. The SiGe layer 44 may then be subjected to an ion implantation process as shown by arrows 46 to form the base region in contact with the underlying insulator layer 12b.

It should be understood that the ion implantation process introduces a concentration of a dopant in the substrate 12 (e.g., semiconductor layer 12c). In embodiments, a patterned implantation mask may be used to define selected areas exposed for the implantation. The implantation mask used to select the exposed area is stripped after implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The implant is a p-type dopant, e.g., Boron (B).

Figure 10:
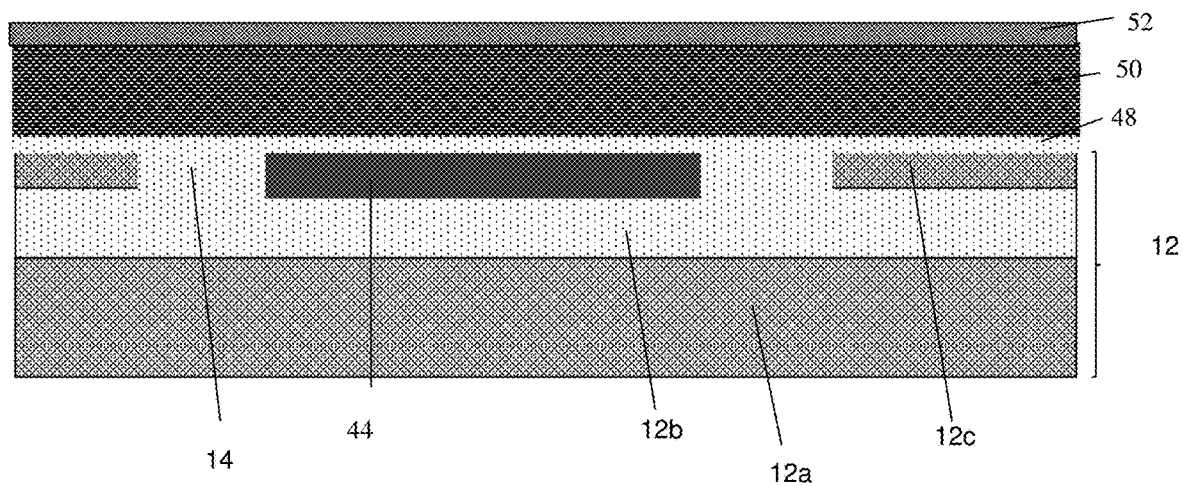

In FIG. 10, an oxide material 48 may be formed over the base region 44 (e.g., doped SiGe material). The oxide material 48 may be a gate oxide material deposited by a conventional deposition method such as CVD. A polysilicon material 50 may be formed (e.g., deposited) over the oxide material 48. A cap layer 52 may be formed over the polysilicon material 50. The cap layer 52 may be SiN, for example. The polysilicon material 50 and cap layer 52 may be deposited by conventional deposition methods such as CVD processes, as one example. As will be described in more detail below, the materials 50, 52 are sacrificial materials that will be removed in subsequent fabrication processes.

Figure 11:
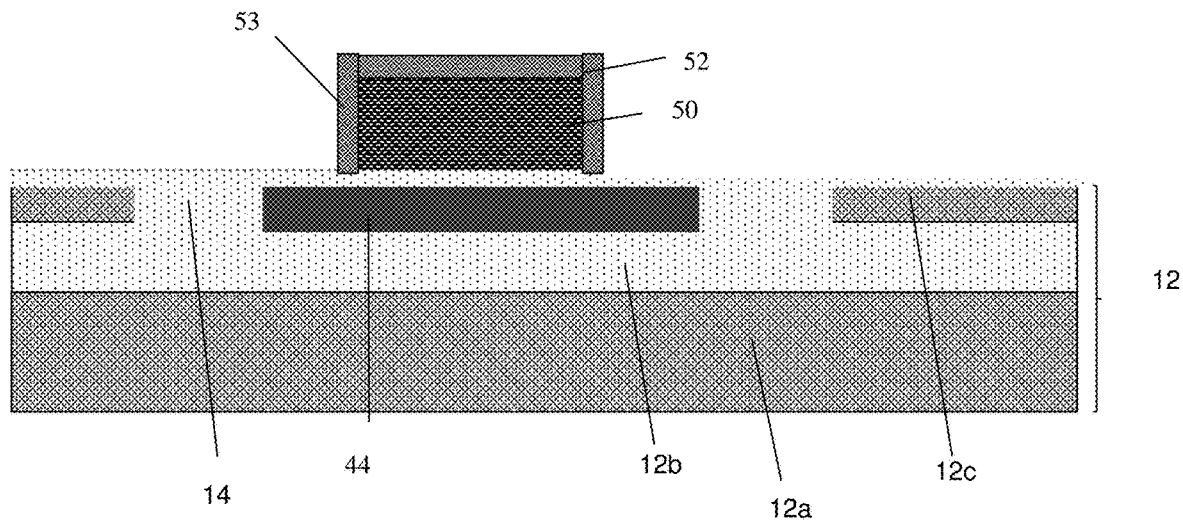

As further shown in FIG. 11, the polysilicon material 50 and cap layer 52 may be patterned by a conventional lithography and etching processes to form an extrinsic base region. A sidewall spacer 53 is formed on the patterned polysilicon material 50 (and cap layer 52. The sidewall spacer 53 may be formed by a conventional deposition process followed by an anisotropic etching process. The sidewall spacer 53 may comprise oxide and nitride materials, as an example.

Figure 12:
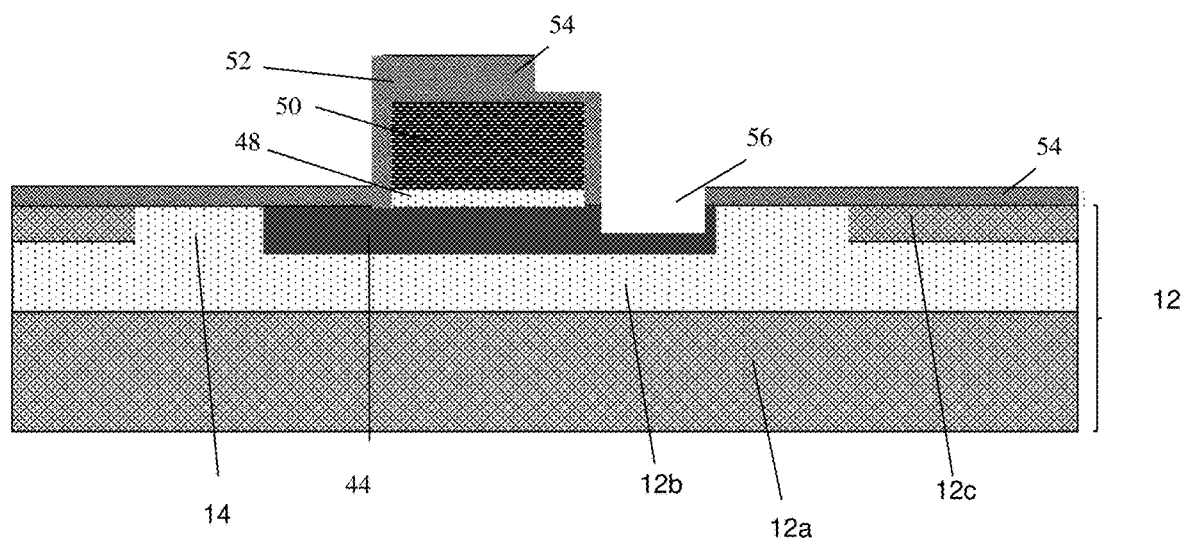

In FIG. 12, a cap layer 54 may then be formed (e.g., deposited) over the patterned polysilicon material and cap layer 52, in addition to the exposed semiconductor layer 12c and shallow trench isolation regions 14. The cap layer 54 may then be subjected to an etching process to form a trench 56 through the cap layer 54 and partially within the underlying semiconductor material 44 (e.g., SiGe base region). In this way, the semiconductor material 44 can be partially recessed in a collector region of the bipolar transistor.

Figure 13:
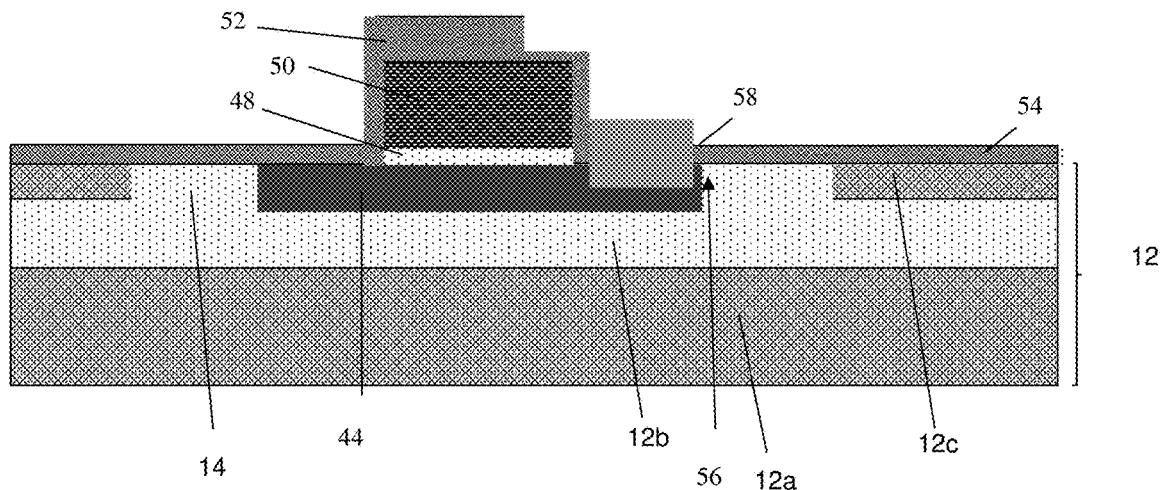

In FIG. 13, a semiconductor material 58 may be formed on the exposed semiconductor material 44, e.g., within and above the trench. In embodiments, the semiconductor material 58 may be an epitaxial material that is grown on the semiconductor material 44 to a height above the cap layer 54. The semiconductor material 58 may be a single crystalline Si material that is lightly doped, in situ, to be used as a raised, single crystalline collector region. The semiconductor material 58 may be lightly doped with N type dopants, e.g., As.

Figure 14:
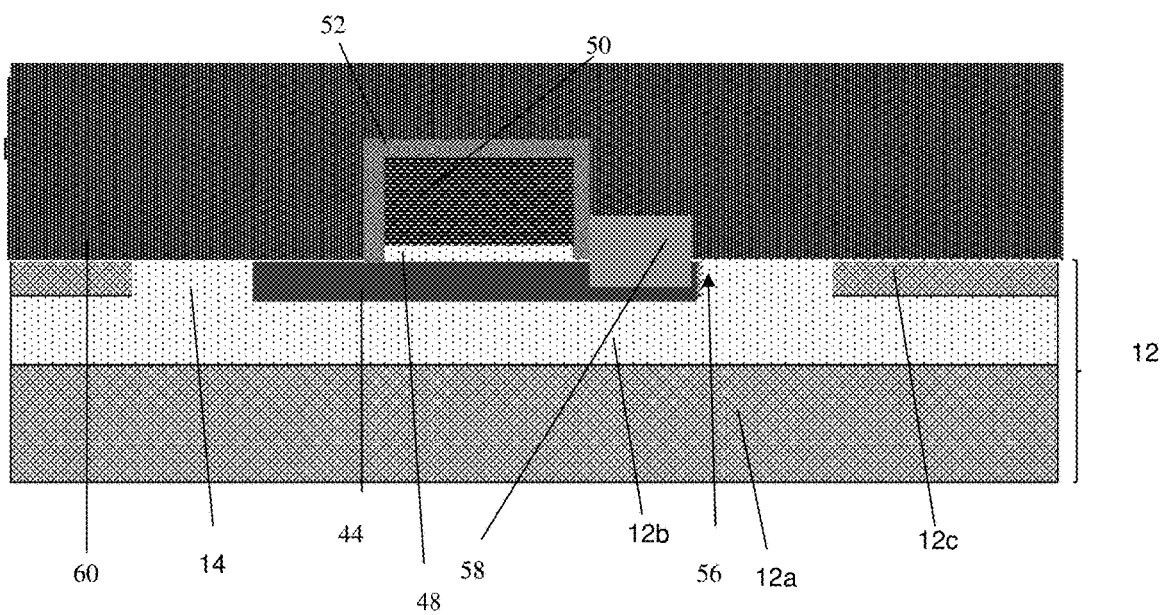

Referring now to FIG. 14, the cap layer 54 may be removed by an anisotropic etching process. In this way, the underlying semiconductor layer 12c is exposed, while also maintaining cap layer 52 on sidewalls of the oxide material 48 and poly silicon material 50. A polysilicon material 60 may be formed over the semiconductor material 58 (e.g., raised, single crystalline collector region), patterned materials 50, 52 (in the extrinsic base region) and the semiconductor layer 12c. As should be understood by those of skill in the art, the polysilicon material 60 may be used to form the emitter region of the bipolar transistor, in addition to a top surface of the collector region (which comprises single crystalline semiconductor material 58. The polysilicon material 60 may be N+ doped material as already described herein such that no further explanation is required.

Figure 15:
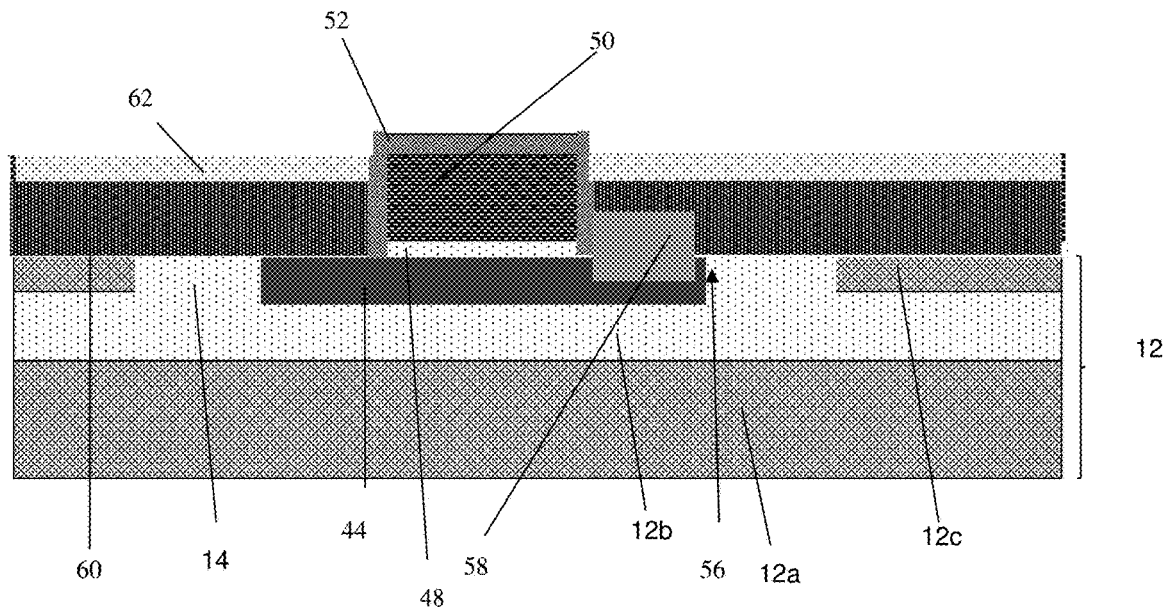

In FIG. 15, the polysilicon material 60 may be recessed to below a height of the extrinsic base region (e.g., patterned materials 50, 52). In embodiments, the recessing may be performed by a blanket polysilicon etching process as is known in the art. A cap layer 62 may then be deposited on the recessed polysilicon material 60. The cap layer 62 may be an oxide material, for example, which is used to protect the polysilicon material 60 from subsequent etching processes that removes materials 50, 52 in the extrinsic base region. Following the deposition of the cap layer 62, a planarization etching process is performed to open the top of the emitter region, e.g., expose the material 52, for subsequent processing.

Figure 16:
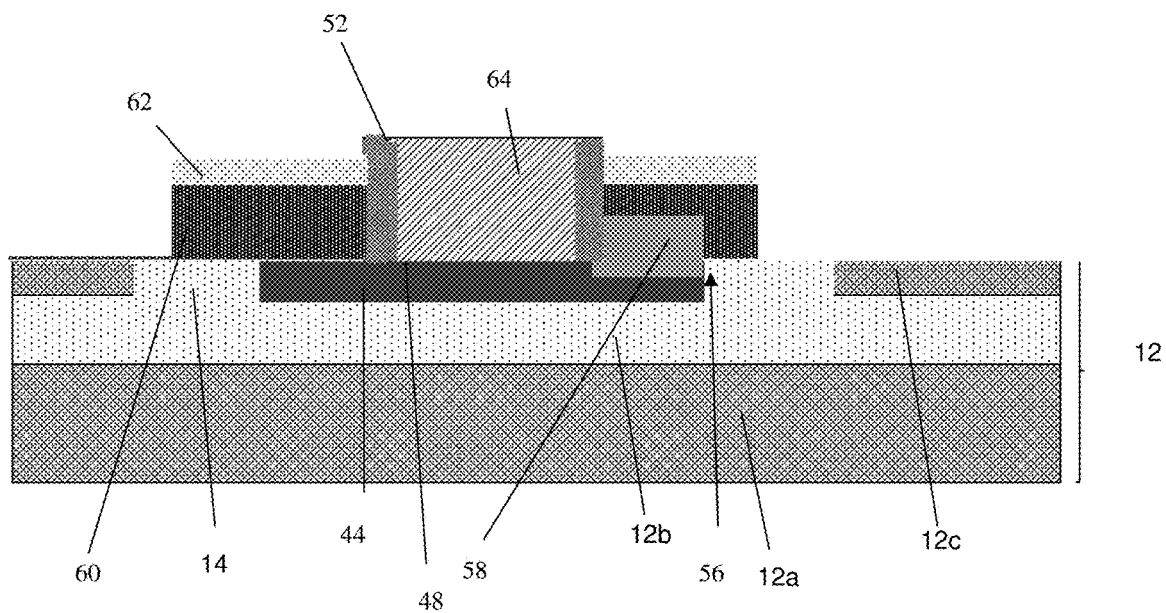

As further shown in FIG. 16, the upper portion of cap layer 52 is removed, followed by removal of the polysilicon material 50 and the oxide material 48. This process, though, will leave intact the sidewalls of the cap layer 52. Also, this process will leave intact the cap layer 62. A semiconductor material 64 may be formed within the opening between the sidewalls 52. In embodiments, the semiconductor material 64 may be a doped SiGe material used as an extrinsic base region of the bipolar transistor. The semiconductor material 64 may be P+ doped as already described herein, i.e., in situ doping during an epitaxial growth process. Semiconductor material 64 may be formed by a selective epitaxial growth process such that it only forms in the opening above the base region and nowhere else. The materials 60, 62 may be patterned to define an emitter region and a collector region of the bipolar transistor.

Figure 17:
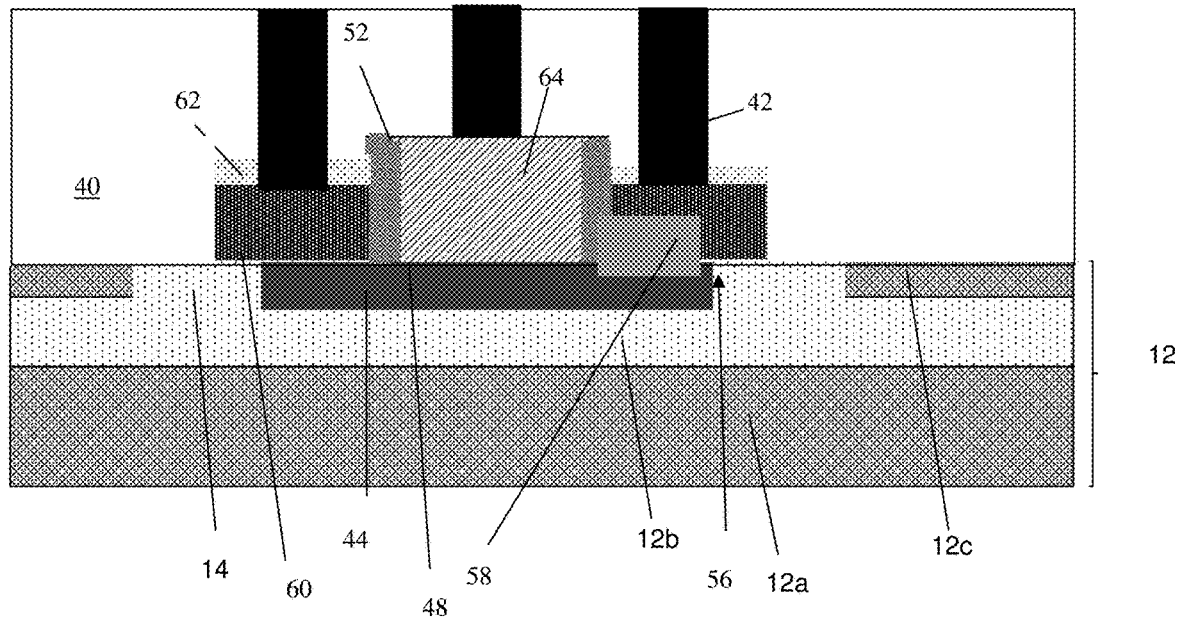

In FIG. 17, metallization features 42 (e.g., interconnect features) contact to the emitter region (e.g., polysilicon material 60), extrinsic base region (e.g., semiconductor material 64) and the raised, collector region (e.g., polysilicon material 60 and semiconductor material 58). The metallization features 42 may be formed in the dielectric material 40 as already described with respect to FIG. 8 such that no further explanation is required herein for a complete understanding of the present disclosure. As is known, a silicide layer as known in the art may be formed on upper surfaces of extrinsic base 64, polysilicon emitter 60 and polysilicon collector region 60 above 58 prior to metallization features 42. For example, a Co, Ti, NI, Pt, or similar silicide could be formed prior to metallization features 42

Figure 18:
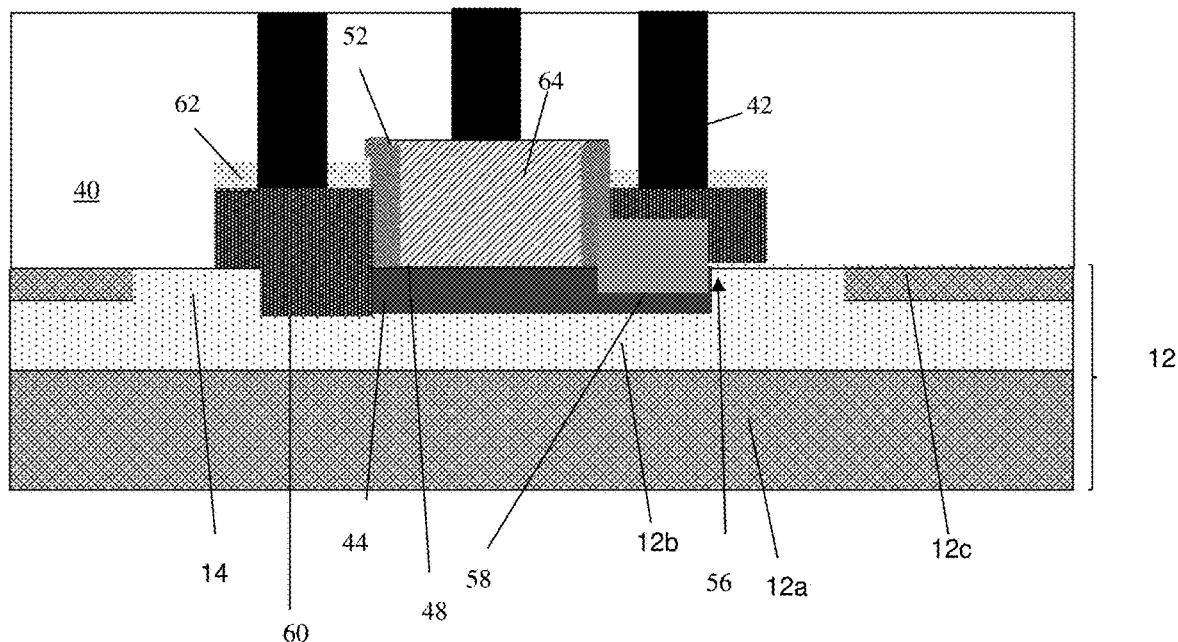
FIG. 18 shows a bipolar transistor in accordance with additional aspects of the present disclosure.

FIG. 18 shows a bipolar transistor in accordance with additional aspects of the present disclosure. In FIG. 18, the bipolar transistor 10a includes the emitter comprised of the polysilicon material 60 extending to and contacting the insulator layer 12b of the substrate 12. In addition, the polysilicon material 60 extends onto the side of the intrinsic base region comprising the semiconductor material 44, e.g., lightly p-doped SiGe material. This layout can be provided by using an additional lithography and etching process to form a trench through the cap layer 54 and semiconductor material 44 in FIG. 13, followed by the deposition of the polysilicon material 60 within the trench.

The transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an extrinsic base comprising semiconductor material;
   an intrinsic base comprising semiconductor material which is located below the extrinsic base;
   a polysilicon emitter on a first side of the extrinsic base and touching the intrinsic base;
   a raised collector on a second side of the extrinsic base; and
   sidewall spacers on the extrinsic base which separate the extrinsic base from the polysilicon emitter and the raised collector.

2. The structure of claim 1, wherein the extrinsic base comprises P+ doped semiconductor material above a semiconductor on insulator substrate and the polysilicon emitter on the first side of the extrinsic base touches the intrinsic base.

3. The structure of claim 1, wherein the intrinsic base comprises SiGe material above a semiconductor on insulator material.

4. The structure of claim 1, wherein the raised collector is an epitaxially grown semiconductor material partially within a semiconductor on insulator substrate.

5. The structure of claim 1, wherein the raised collector is an epitaxially grown single crystalline semiconductor material over a semiconductor on insulator substrate.

6. The structure of claim 5, wherein the epitaxially grown single crystalline semiconductor material comprises n-doped Si based semiconductor material.

7. The structure of claim 2, further comprising a marker layer under the raised collector and being of a different material than the raised collector and the semiconductor on insulator substrate.

8. The structure of claim 2, wherein the polysilicon emitter contacts buried insulator material under the semiconductor on insulator substrate.

9. The structure of claim 1, wherein the raised collector comprises an epitaxially grown semiconductor material partially within a semiconductor on insulator substrate.

10. The structure of claim 9, wherein the intrinsic base comprises SiGe material within the semiconductor on insulator substrate.

11. The structure of claim 1, wherein the extrinsic base, the polysilicon emitter and the raised collector are laterally separated from one another over a semiconductor on insulator material.

12. The structure of claim 1, wherein the extrinsic base, the polysilicon emitter contacts a side of the intrinsic base and a semiconductor on insulator material.

13. The structure of claim 1, wherein the sidewall spacers comprising a first sidewall spacer and a second sidewall spacer, the first sidewall spacer is between and contacts the extrinsic base and the second sidewall spacer, the second sidewall spacer is between and contacts the raised collector and the first sidewall spacer, and the extrinsic base, the sidewall spacers and the raised collector being laterally separated at a same level of the structure.

14. A structure comprising:
    an emitter comprising polysilicon over a semiconductor on insulator substrate;
    an extrinsic base laterally adjacent to the emitter and over the semiconductor on insulator substrate;
    a raised collector laterally adjacent to the extrinsic base and comprising single crystalline semiconductor material over the semiconductor on insulator substrate; and
    sidewall spacers comprising dielectric material separating the extrinsic base from the emitter and the raised collector,
    wherein the single crystalline semiconductor material is partially within the semiconductor on insulator substrate.

15. The structure of claim 14, wherein the emitter is within the semiconductor on insulator substrate and contacts to an underlying buried insulator layer.

16. The structure of claim 14, wherein the polysilicon material is above the raised collector.

17. The structure of claim 14, further comprising an intrinsic base under the extrinsic base, the intrinsic base being within the semiconductor on insulator substrate.

18. The structure of claim 17, wherein the intrinsic base comprises a different semiconductor material than the semiconductor on insulator substrate.

19. The structure of claim 14, wherein the extrinsic base and the poly silicon material of the emitter contacts a side of an intrinsic base and the semiconductor on insulator substrate.

20. A method comprising:
    forming an extrinsic base comprising semiconductor material;
    forming an intrinsic base comprising semiconductor material which is located below the extrinsic base;
    forming a polysilicon emitter on a first side of the extrinsic base;
    forming a raised collector on a second side of the extrinsic base; and
    forming sidewall spacers on the extrinsic base which separate the extrinsic base from the polysilicon emitter and the raised collector.

* * * * *